United States Patent [19]
Langford, II et al.

[11] Patent Number: 5,115,435
[45] Date of Patent: * May 19, 1992

[54] METHOD AND APPARATUS FOR BUS EXECUTED BOUNDARY SCANNING

[75] Inventors: Thomas L. Langford, II; Philip W. Bullinger, both of Wichita, Kans.

[73] Assignee: NCR Corporation, Dayton, Ohio

[*] Notice: The portion of the term of this patent subsequent to Aug. 7, 2007 has been disclaimed.

[21] Appl. No.: 423,924

[22] Filed: Oct. 19, 1989

[51] Int. Cl.$^5$ .......................................... H04B 17/00
[52] U.S. Cl. ................................ 371/22.3; 371/25.1; 371/22.1
[58] Field of Search ................... 371/22.3, 25.1, 22.1

[56] References Cited

U.S. PATENT DOCUMENTS

| | | | |
|---|---|---|---|
| 4,597,080 | 6/1986 | Thatte et al. | 371/25 |
| 4,688,222 | 8/1987 | Blum | 371/25 |
| 4,697,267 | 9/1987 | Wakai | 371/25 |
| 4,710,931 | 12/1987 | Bellay et al. | 371/25.1 |
| 4,710,933 | 12/1987 | Powell et al. | 371/25.1 |
| 4,814,639 | 3/1989 | Saito et al. | 307/303 |
| 4,872,169 | 10/1989 | Whetsel et al. | 371/22.3 |
| 4,875,003 | 10/1989 | Burke | 324/73 R |
| 4,879,717 | 11/1989 | Sauerwald et al. | 371/22.3 |
| 4,912,709 | 3/1990 | Teske et al. | 371/22.1 |
| 4,945,536 | 7/1990 | Hancu | 371/22.3 |
| 4,947,395 | 8/1990 | Bullinger et al. | 371/22.3 |

OTHER PUBLICATIONS

"Low-Cost Testing of High-Density Logic Components" by Robert W. Bassett et al., IEEE, Apr. 1990, pp. 15-27.

IEEE, Feb. 1990, "Designing and Implementing an Architecture with Boundary Scan" by R. P. Van Riessen, et al.

IEEE, Feb. 1989, pp. 36-44, "Boundary Scan with Built-In Self-Test" by Clay S. Gloster, et al.

TI Technical Journal, Jul.-Aug. 1988, pp. 48-59, "A Standard Test Bus and Boundary Scan Archi." by Lee Whetsel.

*Primary Examiner*—Joseph Ruggiero
*Assistant Examiner*—Ly V. Hua
*Attorney, Agent, or Firm*—Jack R. Penrod

[57] ABSTRACT

A boundary scan test circuit for inclusion into ASIC and or VLSI circuits which does not require any additional pads/pins to support full boundary scan functionality. The invention uses the power and capability of existing address and data buses to transfer test data into the integrated circuit under boundary scan test, and uses the same buses to transfer test results out of the integrated circuit under test to be interpreted by the test processor of the system.

14 Claims, 9 Drawing Sheets

METHOD AND APPARATUS FOR BUS EXECUTED BOUNDARY SCANNING

BACKGROUND OF THE INVENTION

The present invention relates to the testing of an electronic system or subsystem having one or more integrated circuits, and more particularly to a method and apparatus for providing boundary scan testing for each integrated circuit that is a part of the system or sub-system. The new method and apparatus uses a system or sub-system parallel bus as the interface and control connection for each integrated circuit having boundary scan test circuitry.

The increasing use of very large scale integrated circuits, i.e. integrated circuits with greater than 100,000 active devices, has led to a testability problem of systems or sub-systems made up of VLSI circuits. The problem stems from the fact that one VLSI circuit typically has 100 to 200 input/output pins, but it contains more active devices than the most sophisticated electronic system of the previous generation. However, the previous generation system devices would have many thousands of pins at which various test measurements might be performed. The result then of having systems or sub-systems comprised of VLSI circuits performing highly sophisticated functional capabilities usually is decreased accessibility and testability with respect to their pre-VLSI counterparts.

This testability problem is aggravated further by the increasing use of application specific integrated circuits. ASICs combine multiple elemental functions within a single integrated circuit in order to perform a complex function. ASICs also save processing time that would otherwise be used shuttling signals between elemental function integrated circuits, thereby increasing performance. Furthermore, in large lots, ASICs have a lower cost than the total cost of the individual SSI/MSI/LSI components which each ASIC replaces. Therefore, the hardware trend towards the use of more complex ASICs also is a trend towards a lessening of system testability.

The VLSI/ASIC testability problem is further aggravated by the increasing use of high density integrated circuit mounting techniques, such as surface mount, tape automated bonding (TAB), chip-on-board (COB) and hybrid technology techniques, especially when used in conjunction with multi-layer circuit boards. The result being that very few input/output pins may be readily accessible by physical probing. But even when the input/output pins are physically accessible for testing, the input/output pin may be electrically connected to many other components (as in parallel address and data buses) and be very difficult to test independently.

The testability problem is not a minor one. Numerous manufacturers of complex electronic systems have recognized the need to locate and repair faulty components before and after those systems reach the customers. In-field repair inherently has higher costs because of the transportation expense of sending repair personnel and equipment to a customer's location, so any existing faults should be corrected before the system is sold. Further, the customer often is partially or totally idled by a faulty system, so the customer needs a system that can be fault diagnosed and repaired quickly. An inability to test and locate faulty components affects both the system manufacturer and the customer adversely.

One solution to the testability problem of complex and densely populated systems is known from a boundary scan technique proposed by an international industry group known as the joint test action group (JTAG). The JTAG boundary scan technique adds an input decoupling buffer and/or an output coupling buffer between each integrated circuit pin and the functional circuit that the pin normally connects to at both the physical and logical boundary of each integrated circuit using this technique. Each buffer has a register associated with it so each buffer is switchable between normal and test functions. In this manner, the buffers may be used to divide the system or sub-system into testable portions, or to receive or transmit signals to or from the integrated circuit pins. The proposed JTAG boundary scan technique interconnects each of the register circuits in series. This series connection requires at least two pins of the total pin complement of the integrated circuit package, and the usual configuration requires four pins to implement the typical JTAG boundary scan interconnections.

The JTAG solution, or any similar solution, to the testability problem which includes the addition of two or more dedicated test pins is undesirable because the number of pin connections available to connect the internal functionality with the external printed circuit board often is the greatest limitation faced by an integrated circuit designer. Each pin must have a pad area on the integrated circuit chip for connection to the pin. The more pads/pins that are required, the larger will be the required chip area. The larger the chip area, the smaller the quantity of chips which can be produced from each semiconductor wafer and the higher the cost per chip. This is purely a size limitation on a per square inch of substrate wafer basis, and does not include the cost of a lower yield inherent with larger integrated circuits because of an increased likelihood of one or more manufacturing flaws occurring. Nor does it include the increased expense of attaching the four dedicated test pins.

Therefore, it is an object of this invention to provide a method of providing increased testability using boundary scan registers and buffers in conjunction with a parallel system or sub-system bus.

It is another object of this invention to provide a method of providing boundary scan testing without the addition of any pins/connection which are dedicated to testing.

It is a further object of the invention to provide an apparatus for providing increased testability using boundary scan registers and buffers in conjunction with a parallel system or sub-system bus.

It is yet another object of the invention to provide an apparatus for providing boundary scan testing without the addition of any external pins/connections which are dedicated solely to testing or controlling existing pins to operate uniquely when configured in a special test mode of operation, such as multiplexing or level shifting.

It is yet a further object of the invention to provide an apparatus which decreases the time required to perform boundary scan testing.

SUMMARY OF THE INVENTION

Briefly stated, in accordance with one aspect of the invention, the foregoing objects are achieved by providing a boundary scan test system for use in a digital integrated circuit of a digital system. The digital integrated circuit has an integrated circuit data bus that connects to an external system data bus. The digital integrated circuit has a normal mode of operation and a boundary scan test mode of operation. In the boundary scan test mode, the boundary scan test system includes a device for switching data inputs and data outputs of the digital integrated circuit from their respective normal input and output data connections in the normal mode of operation to the boundary scan test mode of operation to form a boundary scan test circuit, a device for inputting a boundary scan test word from the external system data bus via the integrated circuit data bus to the boundary scan test circuit as a test input thereto, and means for outputting a boundary scan test response to the test input, from the boundary scan test circuit via the integrated circuit data bus to the external system data bus, whereby the boundary scan test system boundary scan tests the digital integrated circuit without resorting to any external connections beyond those connected to the data inputs and data outputs used by the integrated circuit during the normal mode of operation.

In accordance with another aspect of the invention, the aforementioned objects are achieved by providing a test circuit, for use in a digital integrated circuit, having boundary scan data inputs, boundary scan data outputs, and a parallel data bus for connection to a parallel system bus. This test circuit includes a device for receiving a control word from the parallel data bus, a device responsive to the control word receiving device for forming a boundary scan test a boundary scan test circuit connected to the boundary scan data inputs and outputs, a device for receiving a scan data test word from the parallel data bus, a device for scanning the scan data test word into the boundary scan inputs and outputs of the boundary scan test circuit, and a device for receiving a scan data test response word responsive to the scan data test word from the boundary scan test circuit.

In accordance with a further aspect of the invention, the aforementioned objects are achieved by providing a method for testing a portion of an integrated circuit having an address decoder and a data bus. The method of testing includes the steps of storing a scan path control word in a control register connected to the data bus, outputting a scan clock signal in response to a plurality of write instructions to a preselected address, receiving a scan data word from the data bus and storing said scan data word in a scan data register, shifting said scan data word out of said scan data register as a sequence of serial data bits in response to said scan clock signal, logically connecting a scan path according to said scan path control word and communicating said sequence of serial data bits over said scan path, assembling said sequence of serial data bits into a scan test word, scanning said scan test word into said portion of the integrated circuit, receiving a test response to said scan test word from said portion of the integrated circuit, and transmitting said test response to the data bus.

Various objects appear from a reading of the foregoing brief description of the invention. Other objects and further scope of applicability of the present invention will appear from the following detailed description. It should be understood that the detailed description indicates one embodiment of the invention and is given by way of illustration only since changes and modifications may be made within the spirit and scope of the invention.

BRIEF DESCRIPTION OF THE DRAWINGS

While the specification concludes with a number of claims particularly pointing out and distinctly claiming the subject matter which is regarded as the invention, it is believed that the invention will be better understood from the following detailed description of the illustrative embodiment taken in conjunction with the accompanying drawings in which:

DETAILED DESCRIPTION OF A PREFERRED EMBODIMENT

Figure 1:
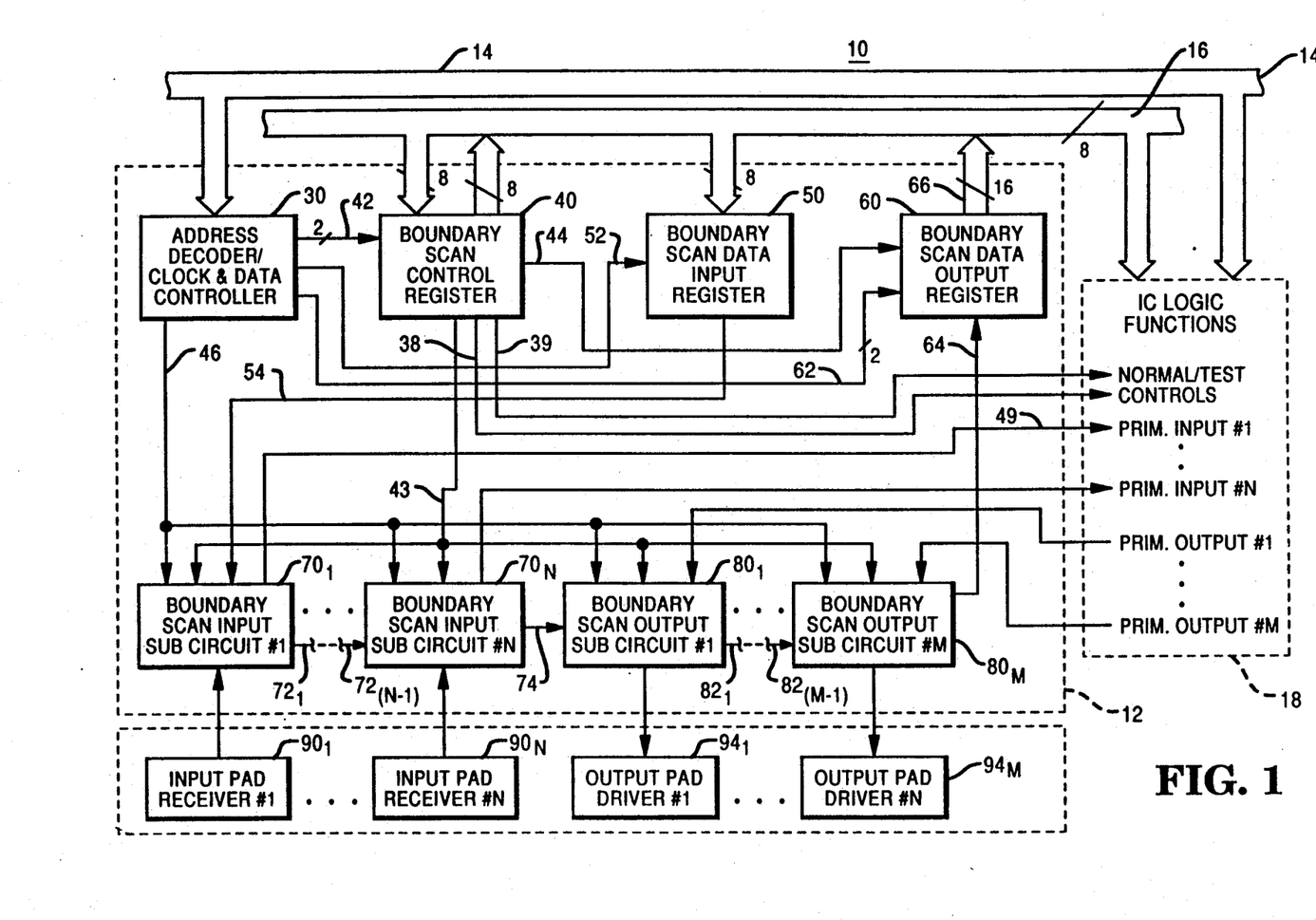
FIG. 1 is a simplified block diagram of the boundary test scan circuit, including a plurality of registers for interfacing to a parallel system bus.

Referring to FIG. 1, there is represented a portion of an integrated circuit 10 having a boundary test scan circuit 12 in accordance with the present invention.

The integrated circuit 10 has an internal address bus 14 that connects to an external system address bus (not shown), and an internal data bus 16 that connects to an external system data bus (not shown). During normal operation, these buses 14, 16 communicate address and data information between IC logic functions 18 and a larger external system (not shown). However, during a test operation, the buses 14, and 16 communicate with the boundary scan test circuit 12 primarily, and with the IC logic functions 18 as required by the test operation. The boundary scan test circuit 12 controls via lines 38 and 39 logic and/or switching circuits (not shown) which logically connect the input signals and the output signals communicated between the IC logic functions 18 and the input/output pads of the integrated circuit 10. The input and output information signals of the buses 14 and 16 because of their higher speed and importance are not controlled by the boundary scan test circuit 12.

Preferably, the external system address bus and the external system data bus are high speed parallel buses. Other embodiments transferring multiplexed address and data on a common parallel bus, or transferring serial data on a serial system bus are, however, deemed to be within the scope of the present invention since the boundary test scan circuit 12, with simple modifications, may operate with any type of system address bus and data bus. By using the system address and system data buses of the electronic system in which the integrated circuit 10 is connected, the boundary test scan circuit 12 is implemented without the need for extra input/output pads and pins and without the need for extra, dedicated traces on the printed circuit board (not shown) on which the integrated circuit 10 is mounted. It will be appreciated that the boundary scan test capabilities are provided without any increases in printed circuit board area, and with a relatively small increase in integrated circuit chip area versus boundary scan test circuits requiring dedicated test pins.

The address bus 14 is connected to an address decoder/clock and data controller 30. The address decoder/clock and data controller 30 decodes the information transmitted across the address bus 14 and when it decodes an address which has been assigned or memory mapped to a boundary scan test function of the integrated circuit 10, the address decoder/clock and data controller 30 enables the boundary scan test function corresponding thereto. One example of an assigned or mapped address function is the scan clock function. Upon decoding the address corresponding to the memory mapped instruction for a boundary scan clock pulse, the address decoder/clock and data controller 30 responds by outputting a boundary scan clock pulse on conductor 32 (shown in FIG. 2A) which is derived into a boundary scan clock signal on conductor 46 (shown in FIG. 2A) for sequence control of a boundary scan test. These clock signals will be further described below in connection with FIGS. 2A, 2B, and 2C.

The address decoder/clock and data controller 30 is connected to a boundary scan control register 40 by a two conductor control line 42, to a boundary scan data input register 50 by a control line 52, and to a boundary scan data output register 60 by a two conductor READ control line 62. The registers 40, 50, and 60 are connected to the data bus 16 to provide the READING and WRITING of data transfers therewith. The control lines 42, 52, and 62 carry the READ and WRITE enable signals from the address decoder scan clock output to the registers 40, 50, and 60, in a manner that is well known in the art.

The boundary scan control register 40, when enabled by a WRITE signal on line 42, has a word of data written into it from the data bus 16. The data bits stored in register 40 comprise a control word which drives multi-conductor control bus 43 to control the boundary scan input/output circuitry. Control bus 43 controls the operation of boundary scan input sub-circuits $70_1$ through $70_N$ and boundary scan output sub-circuits $80_1$ to $80_M$, which will be explained in greater detail later.

The boundary scan control register 40 when enabled by a READ signal on line 42 reads its contents to the system data bus 16. This READ function is basically a test function to check the integrity of the register 40, its connections to the data bus 16 and its operations. Alternatively this READ capability could be used by a control program as a way of storing the present control word for future use by the control program.

The boundary scan data input register 50 when enabled by a WRITE signal on line 52 has a boundary scan data word written into it by the data bus 16. The boundary scan input register 50 stores the boundary scan data word for further use. The data bits of each data word are serially shifted out of the boundary scan data input register 50 via line 54 into boundary scan input sub-circuit $70_1$. From boundary scan input sub-circuit $70_1$, the serial data bits are shifted to boundary scan sub-circuits $70_2$ to $70_N$ via serial data lines $72_1$ to $72_{N-1}$. If N is greater than the length of one scan data word, multiple scan data words may be sequentially written into the boundary scan data input register 50 and serially shifted to the boundary scan input sub-circuits $70_1$ to $70_N$. Boundary scan input sub-circuit $70_N$ is connected via serial data line 74 to boundary scan output sub-circuit $80_1$. The boundary scan output sub-circuits $80_1$ to $80_M$ are connected via serial data lines $82_1$ through $82_{M-1}$ respectively. Thus, the first M bits from one or more data input words transferred into boundary scan data input register 50 may be serially shifted to boundary scan output sub-circuits $80_1$ through $80_M$, and the next N bits from one or more data input words transferred into boundary scan data input register 50 may be serially shifted to boundary scan input sub-circuits $70_1$ through $70_N$. In this manner, preselected test logic levels are loaded into the boundary scan input sub-circuits $70_1$–$70_N$ and the boundary scan output sub-circuits $80_1$–$80_M$ to perform a specific boundary scan test. The test logic levels stored in the boundary scan input sub-circuits $70_1$ to $70_N$ may be use as test inputs to the internal IC logic functions 18. This allows the testing of circuits of the IC logic functions 18 with combinations of data inputs which might be difficult or impossible to achieve via normal operation of the external circuits (not shown) that are connected to the input pins (not shown) and the input pad receivers $90_1$ to $90_N$. Similarly, the test logic levels stored in the boundary scan output sub-circuits $80_1$ to $80_M$ may be used as test outputs to test output pad drivers $94_1$ to $94_M$, or eternal circuits connected to the output pad drivers $94_1$ to $94_M$ via output pads (not shown).

Each of the boundary scan input sub-circuits $70_1$ to $70_N$ and the boundary scan output sub-circuits $80_1$ to $80_M$ may have another storage sub-circuit (not shown in FIG. 1) which latches the response, if any, of the integrated circuit 10 to the scan test and serially shifts each such test response to the boundary scan data output register 60 via serial data line 64. The boundary scan data output register 60, among other functions, performs a serial to parallel conversion on the data received via line 64. Once a word of data has been converted, it may be read to the data bus 16 for transmission to a processor or other system bus device (not shown).

Figures 2, 2C:
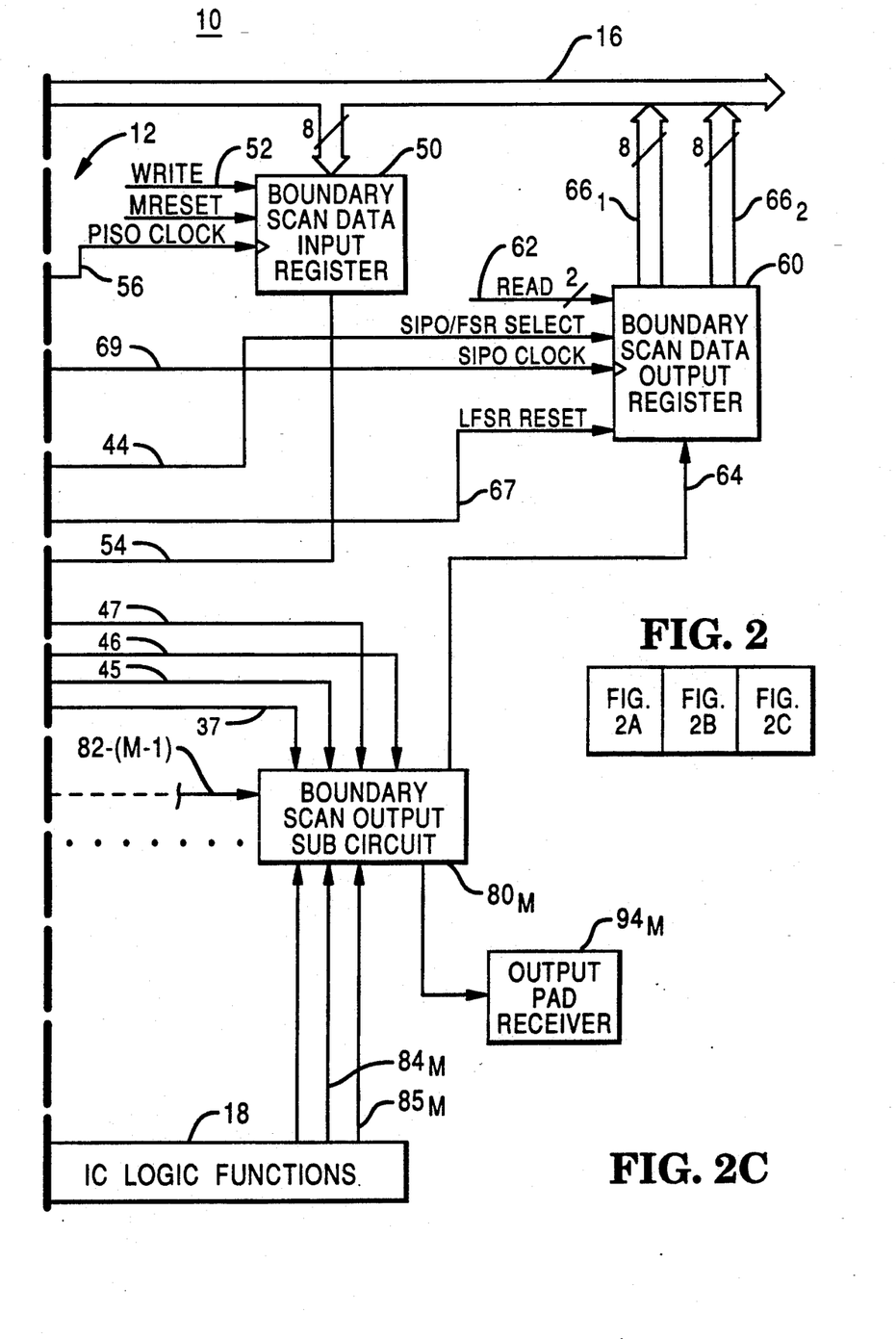
FIGS. 2, 2A, 2B, and 2C form a detailed block diagram of the boundary test scan circuit as shown in FIG. 1.
Figure 2A:
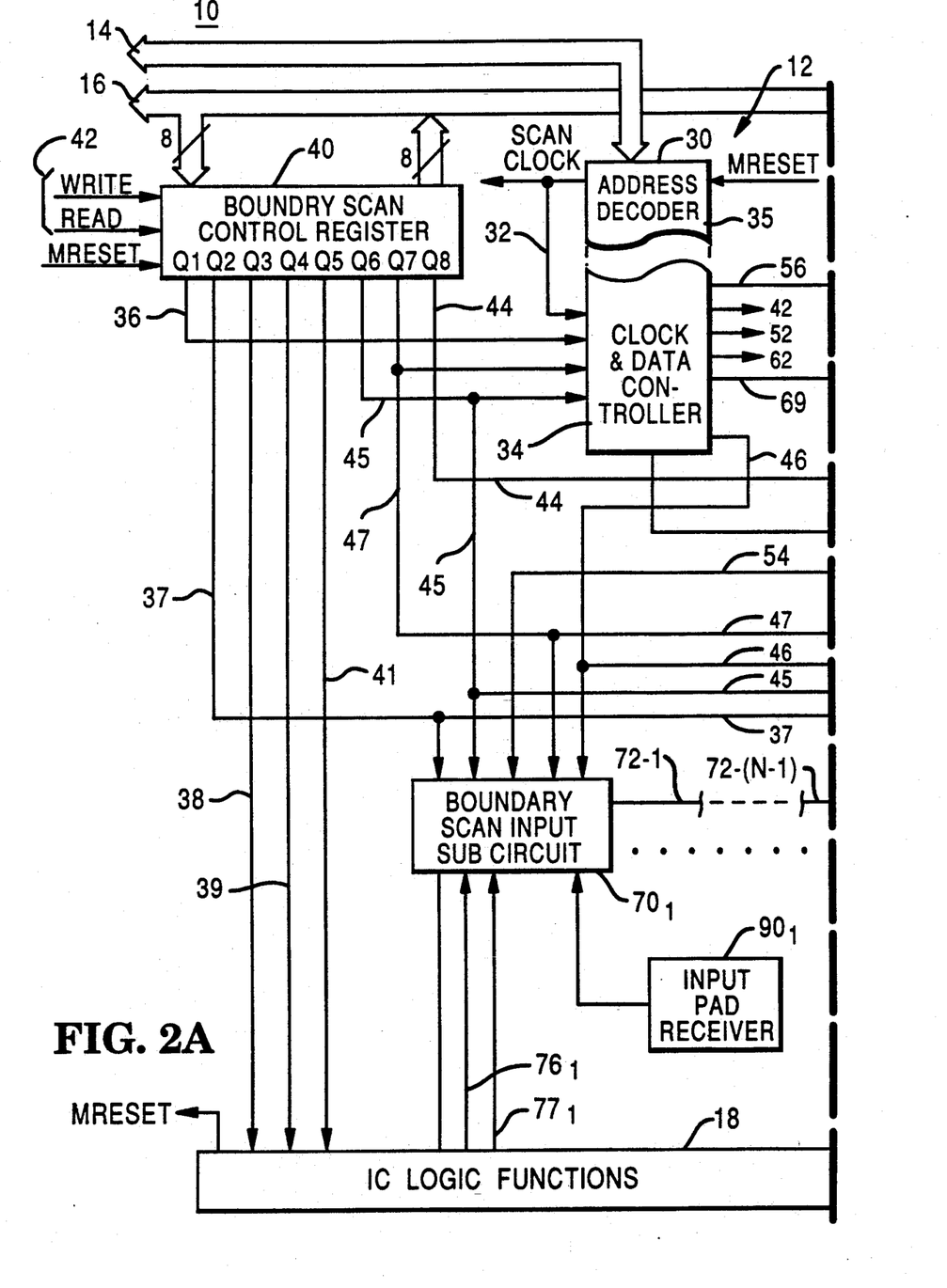
Figure 2B:
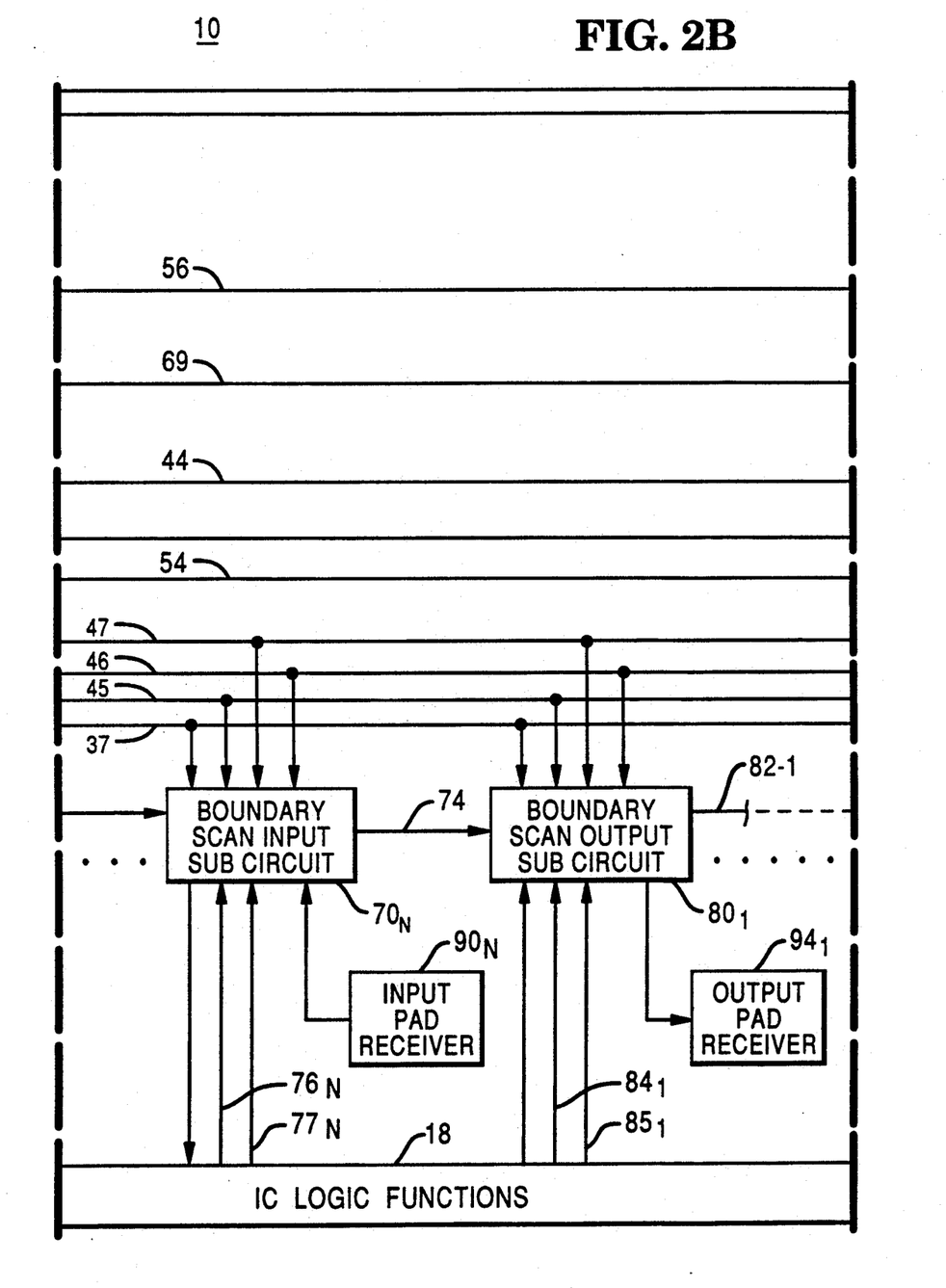

Referring now to FIGS. 2A, 2B and 2C, further details of the boundary scan test circuit 12 will be described. The address decoder clock and data controller 30 is comprised of a clock and data controller 34 and an address decoder 35. The address decoder 35 outputs scan clock pulses, i.e. performs the scan clock function, in response to receipt of a specific address or set of addresses from the address bus 14. The scan clock pulses are conducted via conductor 32 to the clock and data controller 34. In the clock and data controller 34, the scan clock pulses from conductor 32 are converted into the boundary scan clock signal which is connected via conductor 46 to the boundary scan input sub-circuits $70_1$ to $70_N$, and boundary scan output sub-circuits $80_1$ to $80_M$. The connections of READ and WRITE control lines 42, 52, and 62 previously described are partially omitted to simplify FIGS. 2A, 2B, and 2C.

The address decoder/clock and data controller 30, the boundary scan control register 40, and the boundary scan data input register 50 are connected to the master reset (MRESET) terminal of the integrated circuit 10 from the IC logic functions 18. By this connection, when the integrated circuit 10 is reset to a predetermined condition, the registers 40, 50 and 60 are simultaneously reset also. Typically, the remaining boundary scan test circuitry 12 is reset independently of the master reset terminal by the control register 40 bit Q2 in order to allow the integrated circuit 10 to be reset after a boundary scan test without losing the test responses therefrom captured in register 60.

The boundary scan control register 40 is connected to the address decoder/clock and data controller 30 via the multi-conductor line 42 which has a WRITE control conductor and a READ control conductor. When enabled by the WRITE control conductor, the data bus 16 WRITES a boundary scan control word into the register 40. If there is a need to check the boundary scan control word, the contents of the register 40 may be READ to the data bus 16 when enabled by the READ control conductor of line 42. The boundary scan control register 40 is an eight bit register that is parallel loaded from the data bus 16 during each WRITE operation. The eight outputs, Q1-Q8 of the register 40 control various aspects of the boundary scan circuit 12, which will be described further later.

Figure 3:
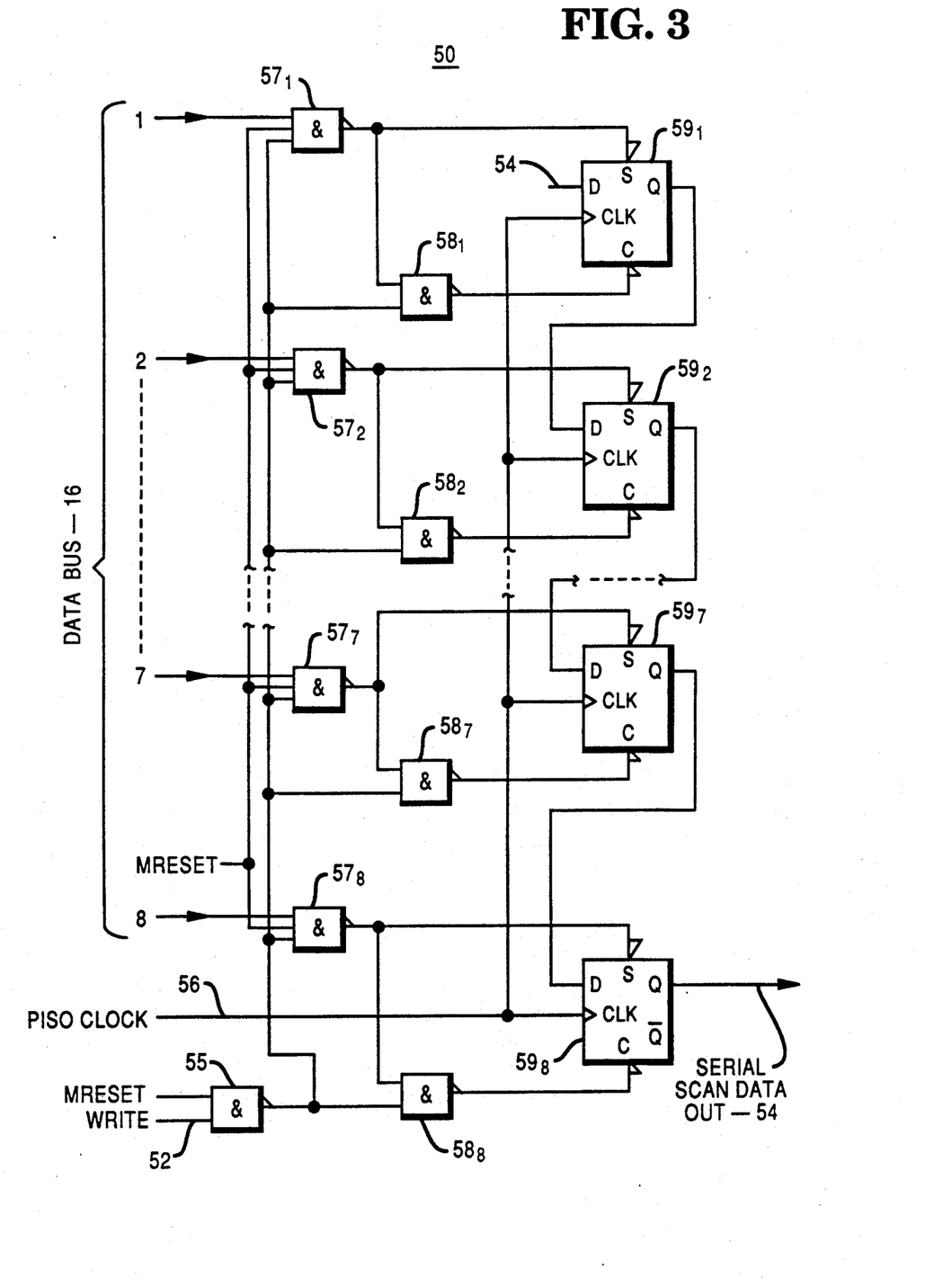
FIG. 3 is a block diagram of a boundary scan data input register shown in FIG. 1.

The boundary scan data input register 50 is connected to the address decoder/clock and data controller 30 by WRITE control line 52 and by parallel-in-serial-out (PISO) clock line 56. A WRITE enable signal enables the data bus 16 to WRITE, in parallel, a scan data input word into the register 50. Referring now to FIG. 3, one embodiment of the boundary scan data input register 50 is shown in detail. An enabling NAND gate 55 enables data to be inputted from the data bus 16 to storage in the scan data input register 50 when the WRITE conductor is driven LOW and MRESET is HIGH. Each line of the data bus 16 is connected to one input of a respective NAND gate $57_1$-$57_8$, the output of enabling NAND gate 55 is a second input of each respective NAND gate $57_1$-$57_8$, and MRESET is connected to the third input of each respective NAND gate $57_1$-$57_8$. The output of each NAND gate $57_1$-$57_8$, which is inverted from each data bus input, is connected to an inverting asynchronous set input of a respective D-type flip-flop $59_1$-$59_8$. Further, the output of each NAND gate $57_1$-$57_8$ is also connected to a respective first input of NAND gates $58_1$-$58_8$. The second input of each of the NAND gates $58_1$-$58_8$ is connected to the output of enabling NAND 55. When enabled by a HIGH level from NAND 55 and MRESET, each NAND gate $58_1$-$58_8$ inverts the input from its respective NAND gate $57_1$-$57_8$ output and drives an inverting asynchronous reset of the respective D-type flip-flop $59_1$-$59_8$. This arrangement ensures that the asynchronous set and clear inputs of each flip-flop $59_1$-$59_8$ are driven by complementary logic signals to unambiguously WRITE the state thereof according to the scan data input byte from the data bus 16. When MRESET is driven LOW, the scan data input register latches $59_1$-$59_8$ are reset regardless of the data bus or WRITE signal logic levels.

The D-input of flip-flop $59_8$ is connected to the Q output of flip-flop $59_7$, the D-input of flip-flop $59_7$ is connected to the next flip-flop Q output, and so forth. The D-input of flip-flop $59_1$ may be either connected to power, ground or $59_8$ output. For this embodiment, it is connected to $59_8$ output 54. According to this arrangement, a scan data input byte that is WRITTEN into the flip-flops $59_1$-$59_8$ asynchronously, is outputted to the serial data out line 54. Each scan data input byte is shifted to the highest bit position of the register 50 by the parallel-in-serial-out clock. As each bit is shifted to the most significant position, i.e. flip-flop $59_8$, each bit is outputted to serial scan data output line 54 to the boundary scan input sub-circuit $70_1$ (not shown in FIG. 3) which will be described later.

The scan data input register 50 may be reset to a value inputted via the data bus 16, in order to initialize or clear it, by driving its WRITE input with a LOW level, which is an asynchronous reset or clear. An initialization such as this is usually performed before each SIPO/LFSR select scan test in order to start from a easily repeatable and well defined register content. It may also be initialized by driving MRESET LOW as described previously.

Figure 4:
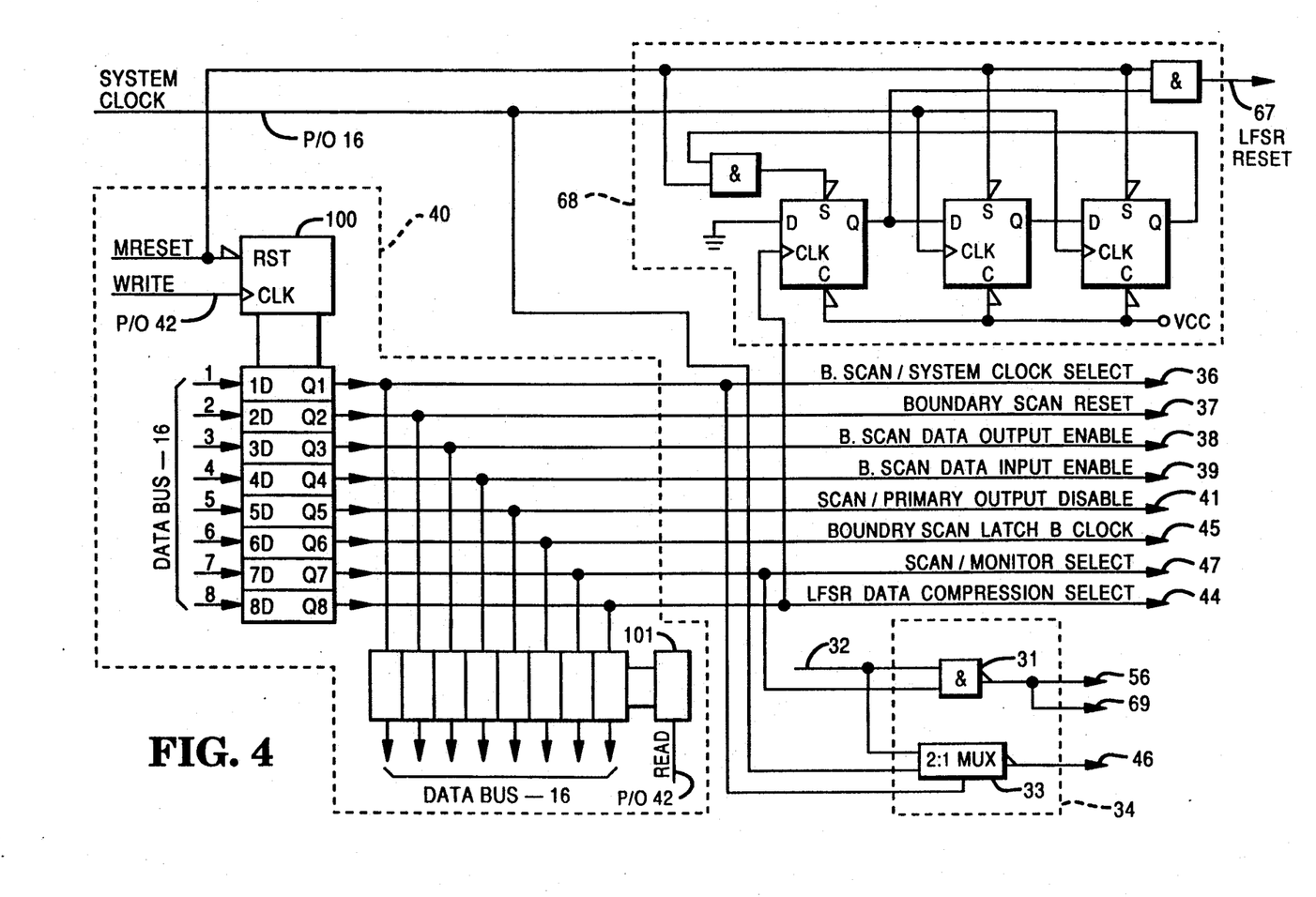
FIG. 4 is a block diagram of a boundary scan control register and portions of an address decoder/clock and data controller as shown in FIG. 1.

Referring now to FIG. 4 and FIG. 1, further details of the clock and data controller 34 portion of the address decoder/clock and data controller 30, and further details of the boundary scan control register 40 are describe.. The boundary scan control register has one set of eight by one bit D-flip-flops and one set of eight by one buffer drivers. The receive set 100 of D-flip-flops is connected to the data bus 16 and the WRITE line portion of control line 42. When the WRITE line is asserted, the receive set of D-flip-flops 100 stores the data that is on the data bus 16. The data bits that are WRITTEN into the receive set 100 of D-flip-flops appear on the outputs Q1-Q8 thereof and are automatically available to the transmitting set 101 of buffer drivers. The transmitting set 101 of buffer drivers is connected to the data bus 16 and the READ line portion of the control line 42. When the READ line is asserted, the eight bits of data that were appearing on the outputs of the receive set 100 will be READ from the transmitting set 101. This arrangement allows interrogation of the state of the register 40 and also allows the use of READ-MODIFY-WRITE type test instructions.

Each of the eight bits of the register 40 has a specific function that it controls. Bit 1, which has Q1 as its control output, controls two primary functions. When set to a HIGH, Q1 selects the boundary scan as the primary clock for all system-latched inputs and outputs. In the embodiment shown in FIGS. 1 and 4, all boundary scan latches operate in a parallel synchronous manner and this control bit is redundant and not necessary.

Bit 2, which has Q2 of register 40 as its output, is a boundary scan reset control bit. The output Q2 is connected via control line 37 to the boundary scan input sub-circuits $70_1$-$70_N$ and output sub-circuits $80_1$-$80_M$. This control bit, when asserted, resets the boundary scan input sub-circuits $70_1$-$70_N$ and output sub-circuits $80_1$-$80_M$ independently of the master reset, i.e. MRESET, signal. This allows the boundary scan reset control bit to clear the boundary scan input sub-circuits $70_1$-$70_N$ and output sub-circuits $80_1$-$80_M$ without clearing the boundary scan output register 60 to permit various scan test combinations.

Bit 3, which has Q3 of register 40 as its output, is a scan data output enable control bit. The output Q3 is connected via control line 38 to the normal/test output control circuits (not shown) of the IC logic functions 18, e.g. the normal or core logic functions. The normal/test control circuits (not shown) respond to the logic level of Q3 on line 38 and make a logical decision to either use system data coming from the IC logic functions 18, or from one of the latches in the boundary scan output sub-circuits $80_1$-$80_M$, to control external devices (not shown) associated with the integrated circuit 10. The output of the normal/test logic circuit (not shown) connects via lines $84_1$-$84_M$ and $85_1$-$85_M$ (shown in FIG. 7) to the boundary scan output sub-circuits $80_1$-$80_M$. The operation of the output sub-circuits $80_1$-$80_M$ will be described later in connection with FIG. 7.

Bit 4, which has Q4 of register 40 as its output, is a scan data input enable bit. The output Q4 is connected via control line 39 to the IC logic functions 18, e.g. the normal or core logic functions. The normal/test input control circuits (not shown) respond to the logic level of Q4 on line 39 and make a logical decision to either use system data coming from the input pad receivers $90_1$-$90_N$ or from one of the latches in the boundary scan input sub-circuits $70_1$-$70_N$ to input data to the IC logic functions 18. The output of the normal/test input control circuit (not shown) connects via lines $75_1$-$75_N$ and $76_1$-$76_N$ (shown in FIG. 6) to the boundary scan input sub-circuits $70_1$-$70_N$. The operation of the input sub-circuits $70_1$-$70_N$ will be described later in connection with FIG. 6.

Bit 5, which has Q5 of register 40 as its output, is a scan/primary output disable control bit. The output Q5 is connected to the IC logic functions 18 via line 41. When asserted this bit instructs the output control circuitry (not shown) of the IC logic functions 18 to disable and/or tri-state the normal outputs of the integrated circuit 10.

Bit 6, which has Q6 of register 40 as its output, is a scan latch B clock control bit. Q6 is connected via line 45 to the clock input of each latch B $78_1$-$78_N$, $88_1$-$88_M$ (see FIGS. 6 and 7) of each boundary scan sub-circuit $70_1$-$70_N$, $80_1$-$80_M$. This allows system data to be either monitored or controlled as it is clocked through latch A $77_1$-$77_N$, $87_1$-$87_M$ while latch B $78_1$-$78_N$, $88_1$-$88_M$ boundary scan sub-circuits remain in a stable state until a boundary scan latch B clock on conductor 45 occurs.

Bit 7, which has Q7 of register 40 as its output, is a scan/monitor select bit. Q7 is connected via line 47 to one input of a NOR gate 31 of the clock and data controller 34. The other input is connected to the scan clock line 32. When asserted, bit 7 will force the output of NOR gate 31 to logic zero and maintain the output at that level. This disables the PISO clock signal on line 56 from affecting the boundary scan data input register 50 (see FIG. 2C), and the SIPO clock on line 69 from affecting the boundary scan data output register 60 (also shown in FIG. 2C).

Referring briefly to FIGS. 2A-2C, line 47 is also connected to each of the boundary scan sub-circuit $70_1$-$70_N$, $80_1$-$80_M$ to control the scan/system multiplexer which is part of each latch A $77_1$-$77_N$, $87_1$-$87_M$. Thus, when bit 7 is not asserted, system data is clocked into each latch A $77_1$-$77_N$, $87_1$-$87_M$ but not into the register 60. On the other hand, when bit 7 is asserted, each latch A $77_1$-$77_N$, $87_1$-$87_M$ is switched to receive boundary scan test data which is clocked from boundary scan input register 50 through boundary scan sub-circuits $70_1$-$70_N$, $80_1$-$80_M$ to the boundary scan output register 60 (see FIGS. 2A-2C).

Referring back to FIG. 4 and FIG. 1, bit 8, which has Q8 of register 40 as its output, is a linear feedback shift register select bit. Q8 is connected to boundary scan data output register 60 via line 44. When asserted, the sixteen bit scan data output register 60 will provide a linear feedback data compression operation on the test data as it is received. Data having a length greater than sixteen bits is compressed into a characteristic signature, which may be checked for correctness at the end of the test. An incorrect signature would indicate that non-data compression testing may be needed to find and diagnose an equipment problem.

Referring again to FIGS. 2A, 2B, and 2C, the scan data output register 60 will be described. The scan data output register 60 is connected to the the data bus 16 by eight bit output buses $66_1$, $66_2$. The sixteen bit storage locations of scan data output register 60 are partitioned into two equal groups of eight locations each. Each group of storage locations has its own READ input via two conductor line 62, such that the first group may be READ out via output bus $66_1$ by strobing one of the READ control inputs, and the second group may be READ out via output bus $66_2$ by strobing the second of the READ control inputs.

Figure 5:
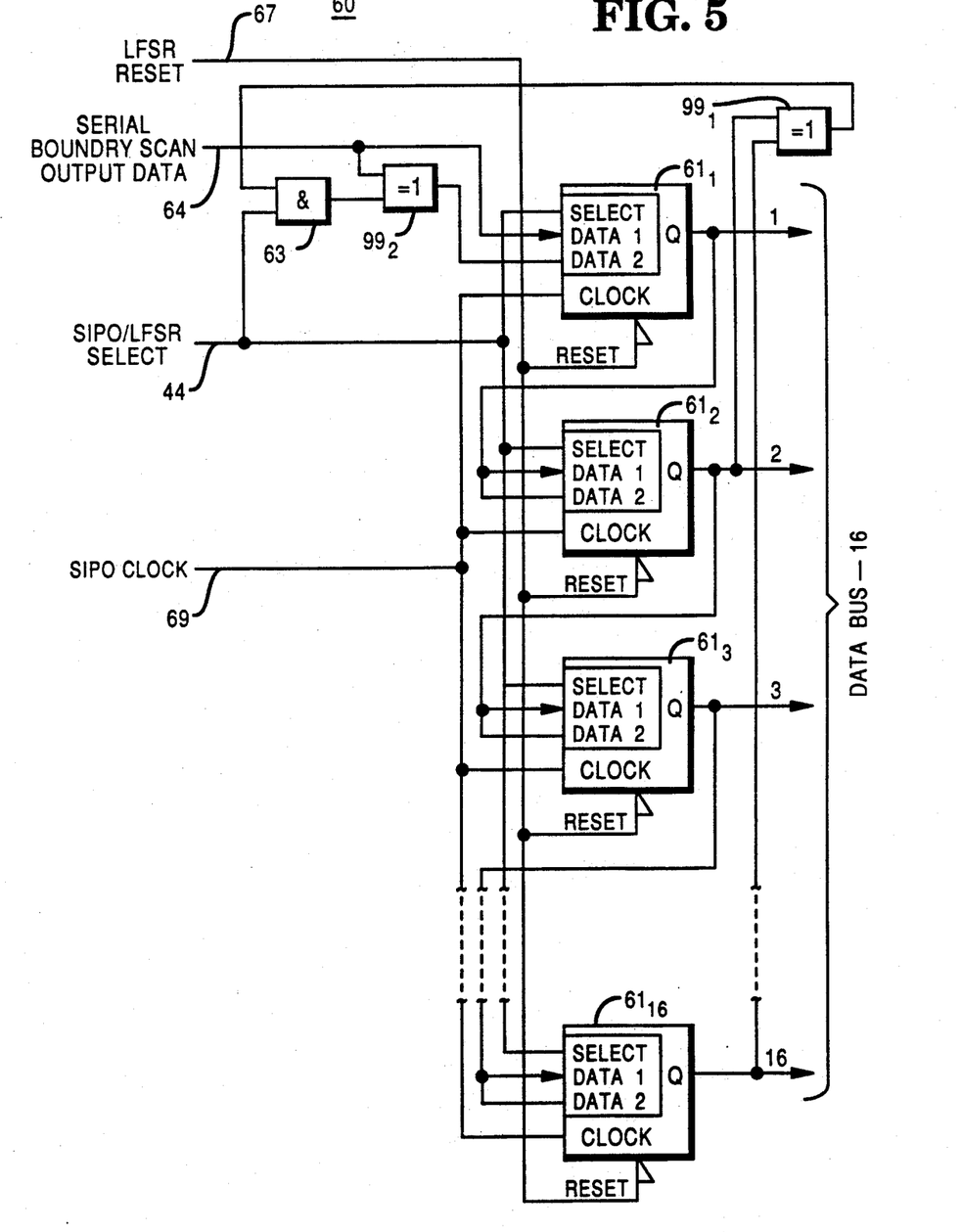
FIG. 5 is a block diagram of a boundary scan data output register shown in FIG. 1.

Further details of the data output register 60 are shown in FIG. 5, which is a block diagram thereof. The scan data output register 60 is a serial-in-parallel-out (SIPO) register, although a more complex register such as a parallel in serial out and a parallel in parallel out register may be used in the serial in parallel out mode. The current data input mode is connected to and controlled by the linear feedback shift register select bit via line 44, as mentioned previously. The SIPO/LFSR select line 44 controls all of the select inputs of an integral two-to-one multiplexer at the input of all latches $61_1$-$61_{16}$. The SIPO/LFSR select line 44 is also connected to an AND gate 63 which operates as enable/disable gate, as will be explained. The Exclusive-OR circuits $99_1$ and $99_2$ are used to generate a signature when the LFSR mode is enabled. When the LFSR modes is ENABLED, the DATA 2 input of latches $61_1$-$61_{16}$ are selected the AND gate 63 is ENABLED. The SIPO clock clocks the input data 64 Exclusive ORed with a feedback signal from gate $99_1$. This process of shifting data through the latches $61_1$-$61_{16}$ and Exclusive-ORing the data input 64 as one input to gate $99_2$ and the output of $99_1$ as the other input to gate $99_2$ allows a cyclic redundancy check to be performed and a signature to be generated. The selection of a polynomial for identifying the feedback selected is well known in the art for sixteen bit signature analysis, and will not be further described here.

When the SIPO mode is selected, latch $61_1$ receives serial data at its DATA 1 input from the last boundary scan latch $80_M$ via line 64. This scan test data is clocked into latch $61_1$ by the SIPO clock signals on line 69. The output of latch $61_1$ is connected to the DATA 1 input of $61_2$ and so forth. This creates a sixteen bit serial-in shift register. In the SIPO mode, sixteen bits of data may be shifted in under the control of the SIPO clock. Data must then be read out via the data bus 16 under the control of READ control lines 62.

The LFSR select bit output is also connected to a trigger circuit 68 (shown in FIG. 4) of the address decoder/clock and data controller 30 via line 67. The trigger circuit $6_{,,}$ generates a linear feedback shift register (LFSR) reset signal which asynchronously resets the sixteen memory locations of the boundary scan data output register 60 (shown in FIG. 4) each time the SIPO/LFSR select signal changes from the SIPO select level to the LFSR select level. This LFSR reset output of the trigger circuit 68 is connected to a LFSR reset input of boundary scan data output register 60 via line 67 (shown in FIGS. 2A, 2B, and 2C). The trigger circuit 68 (shown in FIG. 4) assures that the LFSR reset signal is at least one system clock period in duration. The LFSR select bit is reset to provide a predetermined, consistent initial shift register value for serial and/or data compression testing.

Figure 6:
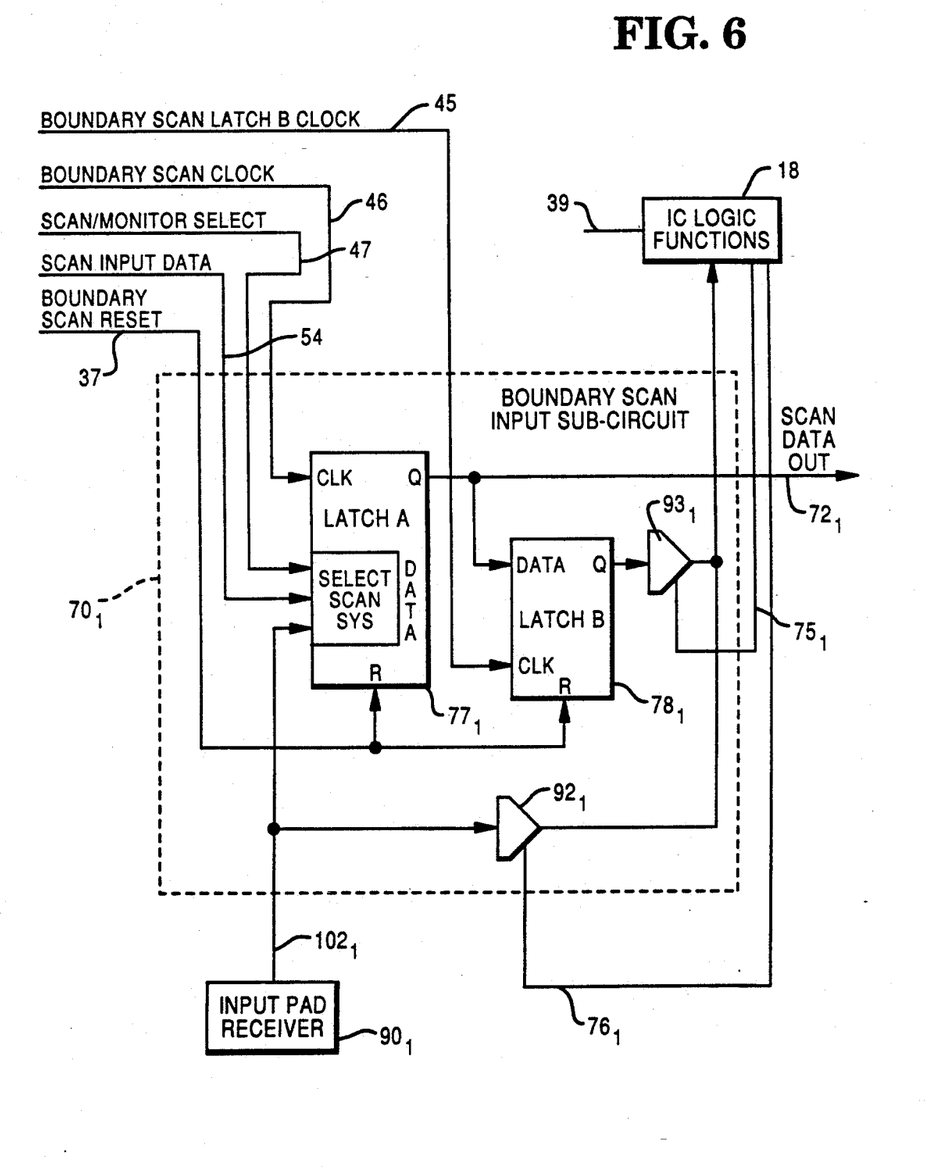
FIG. 6 is a block diagram of a boundary scan input sub-circuit.

Referring now to FIG. 6, a representative boundary scan input sub-circuit $70_1$ is shown in detail. Data is received from a source external to the integrated circuit 10 (not shown in FIG. 6) and is buffered by the input pad driver $90_1$. The output of the input pad receiver $90_1$ is connected to a system input of the latch A $77_1$ via line 102 and also to an input of a tri-state buffer $92_1$. During normal operation the tri-state buffer $92_1$ is turned ON by a logic level from the IC logic functions 18 via the input control line $76_1$. In the ON state, the tri-state gate $92_1$ logically connects the data from the input pad receiver $90_1$ to the normal inputs of IC logic functions 18. During a scan test where the primary objective is to test the internal logic functions 18, the tri-state gate $92_1$ is logically disconnected from the IC logic function input by inducing it into the high impedance state via another logic level on line $76_1$, and gate $93_1$ is ENABLED.

Latch A $77_1$ has an integral two-to-one multiplexer as its input circuit. As mentioned above, one of those inputs is connected via line $102_1$ to the input pad receiver $90_1$. This data input is the system input because the logic signals at this input come from the system. The other data input of latch A $77_1$ is connected via line 54 to the boundary scan data input register 50 (shown in FIG. 1). This data input is the scan data input which receives a serialized version of the parallel test data that is transferred in parallel into the register 50. A select input controls whether the system data input or the boundary scan data input is switched or multiplexed to an internal input of the latch A $77_1$. The select input is connected via line 47 to the Q7 output of the boundary scan control register 40 (shown in FIG. 4). Thus, the input that is switched or multiplexed to the latch portion of latch A $77_1$ is determined by bit 7 of the control word stored in boundary scan control register 40 (see FIG. 4). The other control input to the latch A $77_1$ is the clock input which is connected via line 32 to the address decoder/clock 35. This clock controls the latching of the data on the internal input into the latch portion of Latch A $77_1$. When the scan/monitor select bit is in the default monitor mode, system data may be clocked into latch A $77_M$. This allows the logic of each input pad receiver and the interconnect of the input pad receiver to the outside, i.e. the pad bonding wire, the chip lead frame, the solder joint to the printed circuit board (if any), and the printed circuit conductor connected to each lead to be tested.

The output of latch A $77_1$ is non-inverted and is connected to line $72_1$. Line $72_1$ is connected to the input to the scan input of the next latch A $77_2$ (not shown) and to the input of latch B $78_1$. Often serial data test word is shifted through latch A $77_1$ to the next latch A $77_2$, and so forth, in order to provide predetermined test inputs to latches B $78_1$–$78_N$. Latch B $77_1$ has its clock control input connected via line 45 to the boundary scan latch B clock bit 6 of the boundary scan control register 40 (see FIG. 4). Once the latch A $77_1$ has the test input data desired for a specific test, the data will be latched into latch B $78_1$ by the boundary scan latch B clock signal on line 45. After the input data is latched into the latch B $78_1$, it will be outputted from the Q output thereof to an input of a tri-state gate $93_1$. A control input of the tri-state gate $93_1$ is connected via line $75_1$ to control logic (not shown) within the IC logic functions 18. When the tri-state gate $93_1$ is turned ON, the output of latch B $78_1$ is logically connected to the same input of IC logic functions 18 that the output of tri-state gate $92_1$ is connected to when it is turned ON. And, when the gate $93_1$ is induced into the high impedance state by the level on the control line $75_1$, the gate $93_1$ is logically disconnected from the input of the IC logic functions 18.

Figure 7:
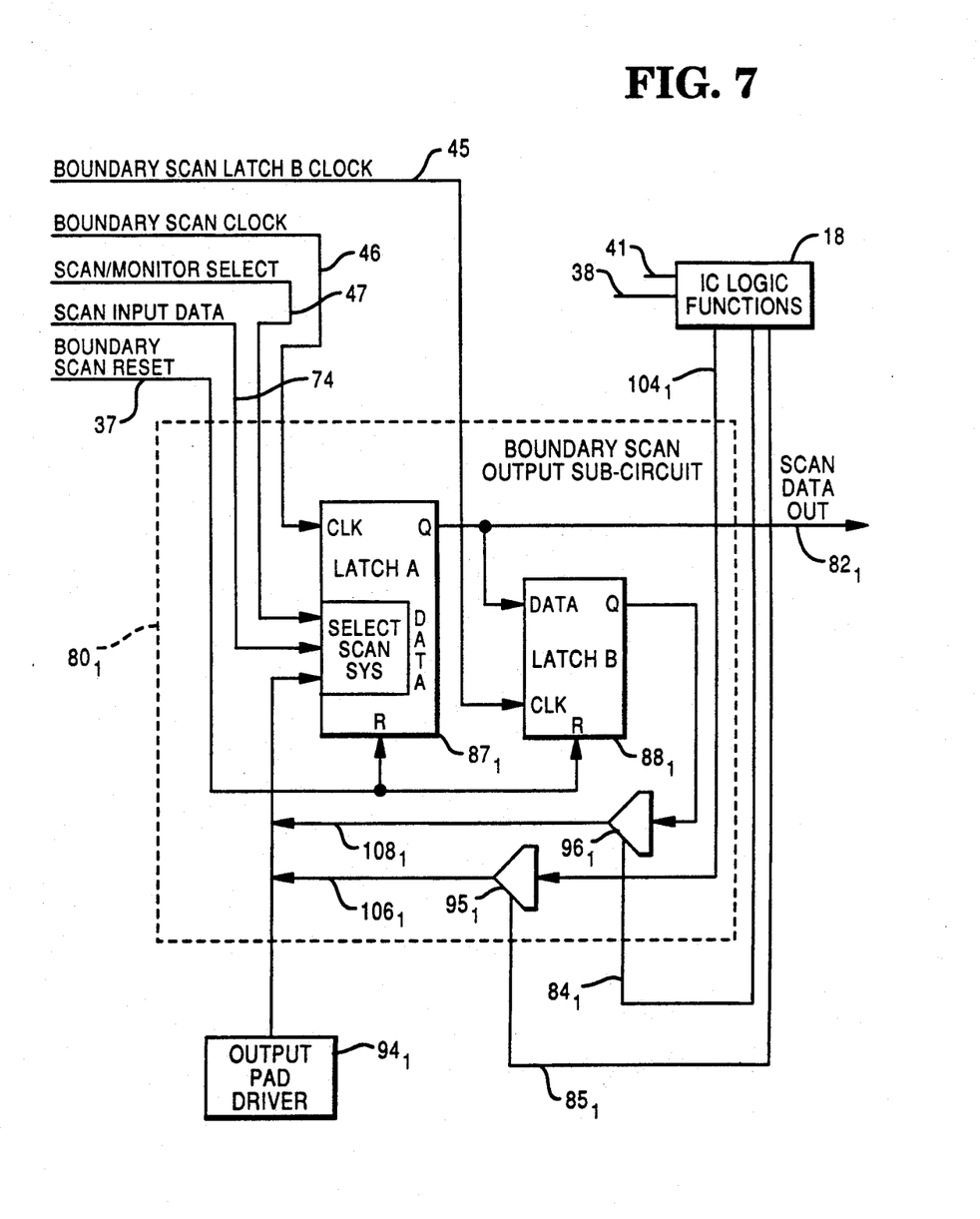
FIG. 7 is a block diagram of a boundary scan output sub-circuit.

Referring now to FIG. 7, a representative boundary scan output sub-circuit $80_1$ is shown in detail. Data is transferred or sourced to an external circuit via the integrated circuit 10 (not shown in FIG. 7). This output is buffered by the output pad driver $94_1$, which decouples the boundary scan output sub-circuit $80_1$ from loading effects of external circuitry (not shown).

A single bit data output portion of the integrated circuit functions 18 is connected via line $104_1$ to a data input of a tri-state gate $95_1$. A control input of the tri-state gate $95_1$ is connected via line 85 to control circuits (not shown) of the IC logic functions 18. An output of the gate $95_1$ is connected via line $106_1$ to an input of the output pad driver $94_1$. The same output is also connected via line $106_1$ to a system data input of latch A $87_1$. During normal operation, e.g. when a scan test is not in process, gate $95_1$ is turned ON, logically connecting the single bit output of the IC logic functions 18 to an input of the output pad driver $94_1$. During a monitor scan test function 47 is driven to a logic LOW. Gate $95_1$ may either be ON as in a monitor test, or the gate $95_1$ may be switched to a high impedance state where the integrated circuit logic functions 18 are logically disconnected from the boundary scan output sub-circuit $80_1$. The high impedance state of gate $95_1$ is the predominate state for boundary scan testing when 47 is driven to a logic HIGH with the sub-circuit $80_1$.

A scan data input of latch A $87_1$ is connected via line 74 to the scan data output of boundary scan input sub-circuit $70_N$. Latch A $87_1$ has an integral two-to-one multiplexer as its input circuit, and the system data input and the scan data input are the two inputs which may be switched or multiplexed thereby. A select control input of the integral two-to-one multiplexer is connected via line 47 to the scan/monitor select bit 7 of register 40 (see FIG. 4). A clock input of latch A $87_1$ is connected via line 46 to the clock and data controller (see FIG. 2A). Thus, the scan/monitor bit of register 40 (see FIG. 4) switches between the scan data input and the system data input for the data that is clocked into latch A $87_1$ by the boundary scan clock.

The Q output of latch A $87_1$ is connected to a subsequent scan data input of latch A $87_2$ (not shown) via line $82_1$. The Q output of latch A $87_2$ is similarly connected to the next subsequent latch A until the last one, $87_M$ is reached. The Q output of latch A $87_M$ is connected via line 64 to the boundary scan output register 60 (shown in FIG. 2C). By this arrangement, a boundary scan test circuit is formed and serial scan test data is clocked serially into latches A $87_1$–$87_M$ to perform a boundary scan test. At the end of the boundary scan test, serial test data results are scan clocked from latches $87_1$–$87_M$ to the boundary scan output register 60 (shown in FIG. 2C) to send the scan test data results to the external system via the parallel data bus 16 (see FIG. 2C).

A latch B $88_1$ has a data input connected to the Q output of the latch A $87_1$, a clock input connected via line 45 to the boundary scan latch B clock (see FIG. 4), and a Q output. The Q output of latch B $88_1$ is connected to a data input of a tri-state gate $96_1$.

A control input to the tri-state gate $96_1$ is connected via line $84_1$ to control circuits (not shown) within the integrated circuit logic functions 18. An output of the gate $96_1$ is connected via line $108_1$ to line $106_1$, the system data input of latch A $87_1$, and the data input to output pad driver $94_1$. By this arrangement, scan test data may be scanned through latches A $87_1$–$87_M$, as described previously, until the scan data is at its desired location. At this point, the scan test bits may be clocked into the latches B $88_1$–$88_M$ by the boundary scan latch B clock. Once the scan data is latched into each latch B $88_1$–$88_M$, the tri-state gates $96_1$–$96_M$, upon enablement via the control line $84_1$–$84_M$, logically connect the Q outputs of the latches B $88_1$–$88_M$ to the output pad drivers $94_1$–$94_M$ and the system inputs of latches A $87_1$–$87_M$. This allows the scan data to be transmitted by the output pad drivers $94_1$–$94_M$ to test the output pad driver circuit, the bond wire connections, the lead frame connections and the device to printed circuit board connections (if mounted on a printed circuit board), and to test circuits (not shown) that are connected externally to the integrated circuit 10.

Latches A $87_1$–$87_M$ and latches B $88_1$–$88_M$ are connected to a common boundary scan reset line 37 by which the latches of the boundary scan output circuits may be reset to a known value to begin or end a boundary scan test.

Thus, it will now be understood that there has been disclosed a boundary scan test circuit for a VLSI/ASIC integrated circuit which provides full boundary scan functionality, but without the necessity of two or four additional connection pads/pins. While the invention has been particularly illustrated and described with reference to a preferred embodiment thereof, it will be understood by those skilled in the art that various changes in form, details, and applications may be made therein. For example, latch $88_M$ and enable driver $96_M$ allow a scan data test output to an external circuit (not shown) to be maintained at a constant level during a scan shift operation involving latch A, circuit $87_M$. It is accordingly intended that the appended claims shall cover all such changes in form, details and applications which do not depart from the true spirit and scope of the invention.

What is claimed as new and desired to be secured by Letters Patent of the United States is:

1. A boundary scan test apparatus for use in a digital integrated circuit of a digital system, the digital integrated circuit having an integrated circuit data bus that connects to an external system data bus, a normal mode of operation and a boundary scan test mode of operation, said boundary scan test apparatus, comprising:

means for switching a plurality of data inputs and a plurality of data outputs of the digital integrated circuit from the normal mode of operation to the boundary scan test mode of operation to form a boundary scan test circuit;

means for inputting a boundary scan test word from the external system data bus via the integrated circuit data bus to the boundary scan test circuit as a test input thereto; and means for outputting a boundary scan test response to the boundary scan test word, from the boundary scan test circuit via the integrated circuit data bus to the external system data bus;

whereby the boundary scan test apparatus boundary scan tests the digital integrated circuit without adding any external lead connections beyond those used by the integrated circuit during the normal mode of operation.

2. For use in a digital integrated circuit having a plurality of boundary scan data inputs, a plurality of boundary scan data outputs, and a parallel data bus; a test apparatus comprising:

means for receiving a control word from the parallel data bus and outputting a select signal in response to said control word;

means for selecting a boundary scan test circuit in response to said select signal, said boundary scan test circuit selecting means is connected to the plurality of boundary scan inputs and outputs;

means for receiving a scan data test word from the parallel data bus;

means for communicating the scan data test word into the plurality of boundary scan inputs and outputs of the boundary scan test circuit; and means for receiving a scan data test response word from a portion of the digital integrated circuit under test in response to the scan data test word from the boundary scan test circuit.

3. The test apparatus according to claim 2, wherein if said boundary scan circuit is selected, a plurality of normal mode connections between a plurality of input pad receivers and core logic circuits of the integrated circuit are disconnected.

4. A bus executed boundary scan apparatus, for use in a digital integrated circuit having an address decoder and a data bus, comprising:

a control register connected to the data bus for receiving a boundary scan control word;

scan clock means for generating a scan clock signal in response to a write instruction to a preselected address decoded by the decoder;

scan data input register means connected to the data bus for receiving a scan data word therefrom;

the scan data input register means having a shifted serial output responsive to said scan clock signal for outputting said scan data word as a sequence of serial bits;

scan path connection means connected to said scan data input register means and responsive to said boundary scan control word for logically connecting a scan path communicating said sequence of serial bits to an output thereof;

assembling means connected to said output of said scan path connection means for assembling said sequence of serial bits into a scan test word for testing a portion of the integrated circuit;

means connected to said assembling means for scanning said scan test word into said portion of the integrated circuit;

output means connected to said portion of the integrated circuit for receiving a test response to said scan test word therefrom; and output register means connected to said output means for storing said test response and transmitting said test response to the data bus.

5. The test circuit set forth in claim 4, wherein said output means is connected to said output register means by a multi-conductor bus which connects a plurality of monitor bits within said test response to a plurality of storage locations within said output register means for storing said test response therein in a parallel data transfer.

6. The test circuit set forth in claim 4, wherein said output means is connected to said output register means by a single-conductor bus which serially transfers said test response to a plurality of storage locations within said output register means for storing said test response therein.

7. For use in a digital integrated circuit having a parallel bus which transfers multiplexed address words and a data words, a test circuit comprising:

a control register connected to said parallel bus and for receiving a scan path control word;

scan clock means connected to said parallel bus for generating a scan clock signal in response to a write instruction to a preselected address word;

scan data input register means connected to said parallel bus for receiving a scan data word therefrom;

said scan data input register having a shifted serial output responsive to said scan clock signal for outputting said scan data word as a sequence of serial bits;

scan path connection means connected to said scan data register means and responsive to said scan path control word for logically connecting a scan path that communicates said sequence of serial bits to an output thereof;

assembling means connected to said output of said scan path connection means for assembling said sequence of serial bits into a scan test word for testing a portion of the integrated circuit;

means connected to said assembling means for scanning said scan test word into said portion of the integrated circuit;

output means connected to said portion of the integrated circuit for receiving a test response to said scan test word therefrom; and output register means connected to said output means for storing said test response and transmitting aid test response via said parallel bus.

8. The test circuit set forth in claim 7, wherein said output means is connected to said output register means by a multi-conductor bus which connects a plurality of monitor bits within said test response to a plurality of storage locations within said output register means for storing said test response therein in a parallel data transfer.

9. The test circuit set forth in claim 7, wherein said output means is connected to said output register means by a single-conductor bus which serially transfers said test response to a plurality of storage locations within said output register means for storing said test response therein.

10. For use in a digital integrated circuit having an address decoder and a data bus a test circuit comprising:

a control register having a plurality of parallel inputs, each connected to a respective control storage location, and each control storage location connected to a respective output, for receiving a control bit into at least one of said locations;

scan clock means connected to the address decoder for generating a scan clock output in response to a write instruction to a preselected address;

scan data input register means, having a plurality of data storage locations, connected to the data bus for receiving a scan data word therefrom;

said scan data input register having a shifted serial output controlled by said scan clock means for outputting said scan data word as a sequence of serial bits;

scan path connection means responsive to at least one of said control bits connected to said scan data register means for receiving and outputting said sequence of serial bits to a logically connected scan path;

means for assembling said sequence of serial bits into a scan data word for testing a digital logic element of said integrated circuit;

scan path means connected to said assembling means for scanning said scan data word as a multi-bit input into said digital logic element of the integrated circuit;

means connected to the integrated circuit for receiving an output of said digital logic element responsive to said multi-bit input; and output register means connected to said digital logic element to receive said output therefrom for storing said output and transmitting said output to the data bus.

11. The test circuit set forth in claim 10, wherein said output means is connected to said output register means by a multi-conductor bus which connects a plurality of monitor bits within said test response to a plurality of storage locations within said output register means for storing said test response therein in a parallel data word transfer.

12. The test circuit set forth in claim 10, wherein said output means is connected to said output register means by a single-conductor bus which serially transfers said test response to a plurality of storage locations within said output register means for storing said test response therein.

13. A method for testing a portion of an integrated circuit having an address decoder and a data bus, comprising the steps of:

a. storing a scan path control word in a control register connected to the data bus;

b. generating a scan clock signal in response to a plurality of write instructions to a preselected address;

c. receiving a scan data word from the data bus and storing said scan data word in a scan data register;

d. shifting said scan data word out of said scan data register as a sequence of serial data bits in response to said scan clock signal;

e. logically connecting a scan path according to said scan path control word and communicating said sequence of serial data bits over said scan path;

f. assembling said sequence of serial data bits into a scan test word;

g. scanning said scan test word into said portion of the integrated circuit;

h. receiving a test response to said scan test word from said portion of the integrated circuit; and i. transmitting said test response to the data bus.

14. The method set forth in claim 13, after step h, further comprising the steps of:

receiving a second scan data word from the data bus and storing said second scan data word in said scan data register;

shifting said second scan data word out of said scan data register as a second sequence of serial data bits in response to said scan clock signal;

assembling said second sequence of serial data bits into a second scan test word;

scanning said second scan test word into said portion of the integrated circuit;

receiving a second test response to said second scan test word from said portion of the integrated circuit; and logically combining said second test response with said first test response into a test response.

* * * * *